United States Patent
Chen et al.

(10) Patent No.: US 11,459,230 B2
(45) Date of Patent: Oct. 4, 2022

(54) MEMS MICROPHONE

(71) Applicant: Fortemedia, Inc., Santa Clara, CA (US)

(72) Inventors: Jien-Ming Chen, Tainan (TW); Feng-Chia Hsu, Tainan (TW); Wen-Shan Lin, Tainan (TW); Hsin-Li Lee, Tainan (TW); Nai-Hao Kuo, Tainan (TW)

(73) Assignee: FORTEMEDIA, INC., Santa Clara, CA (US)

( * ) Notice: Subject to any disclaimer, the term of this patent is extended or adjusted under 35 U.S.C. 154(b) by 358 days.

(21) Appl. No.: 16/835,805

(22) Filed: Mar. 31, 2020

(65) Prior Publication Data

US 2020/0339411 A1 Oct. 29, 2020

Related U.S. Application Data

(60) Provisional application No. 62/837,245, filed on Apr. 23, 2019.

(51) Int. Cl.
| H04R 19/00 | (2006.01) |
| B81B 3/00 | (2006.01) |
| H04R 19/04 | (2006.01) |
| H04R 7/04 | (2006.01) |

(52) U.S. Cl.
CPC ............. *B81B 3/0072* (2013.01); *H04R 7/04* (2013.01); *H04R 19/005* (2013.01); *H04R 19/04* (2013.01); *B81B 2201/0257* (2013.01); *B81B 2203/0127* (2013.01); *H04R 2201/003* (2013.01)

(58) Field of Classification Search
CPC ........ H04R 7/04; H04R 19/005; H04R 19/04; H04R 2201/003; H04R 7/18; H04R 2307/207; B81B 3/0072; B81B 2201/0257; B81B 2203/0127; B81B 2203/0172; B81B 2203/033; B81B 2203/0376

See application file for complete search history.

(56) References Cited

FOREIGN PATENT DOCUMENTS

EP 2071871 B1 * 10/2015 ........... H04R 19/005

* cited by examiner

*Primary Examiner* — Brian Ensey
(74) *Attorney, Agent, or Firm* — McClure, Qualey & Rodack, LLP

(57) ABSTRACT

A MEMS microphone includes a substrate, a backplate disposed on a side of the substrate, a diaphragm movably disposed between the substrate and the backplate, and a plurality of slots formed on the diaphragm. The slots are spaced apart from each other and have a non-constant width to relieve the residual stress on the diaphragm.

20 Claims, 18 Drawing Sheets

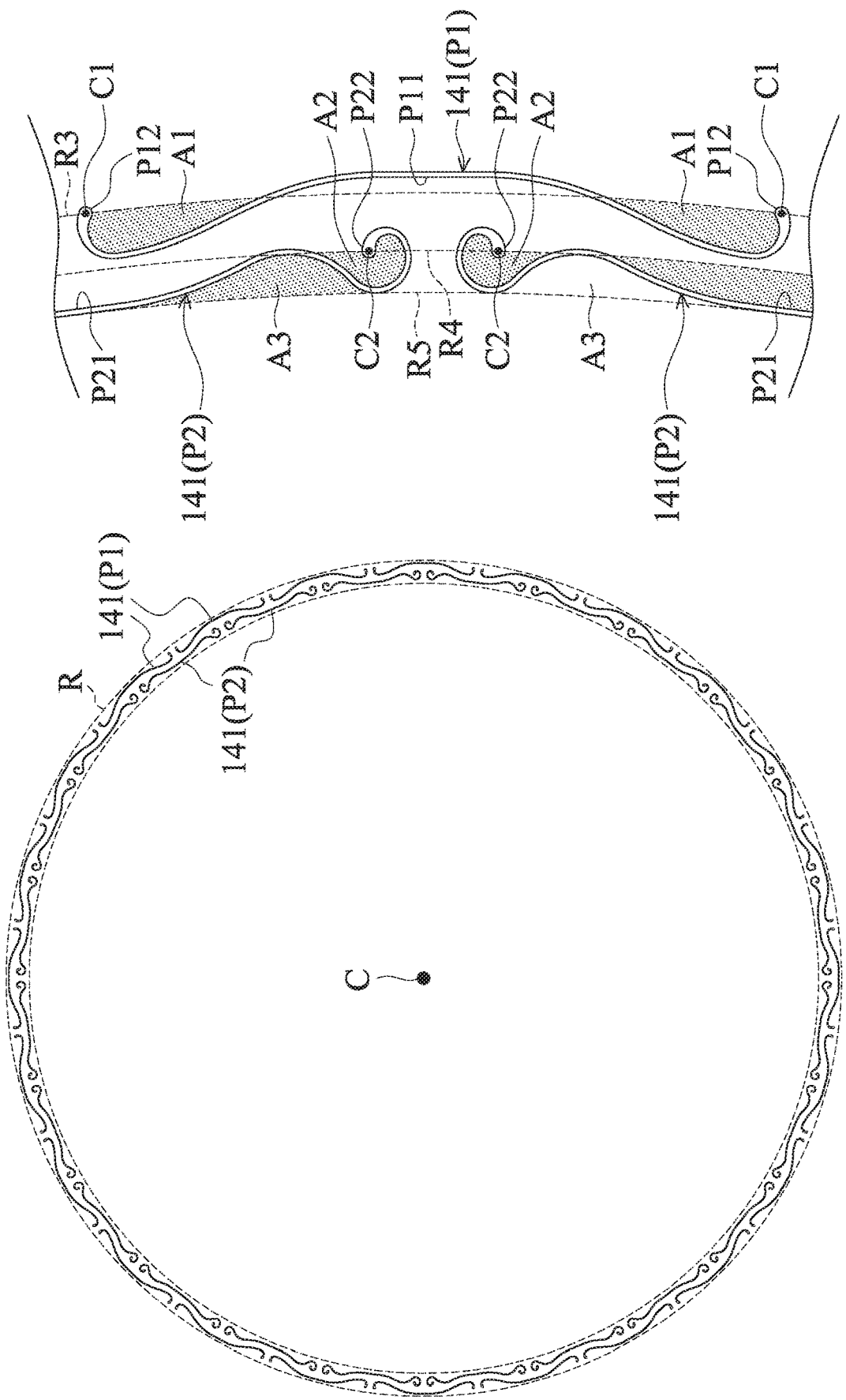

MEMS MICROPHONE

CROSS REFERENCE TO RELATED APPLICATIONS

The present application claims priority of U.S. Provisional Patent Application No. 62/837,245, filed on Apr. 23, 2019, the entirety of which is incorporated by reference herein.

BACKGROUND OF THE INVENTION

Field of the Invention

The invention relates to an acoustic transducer, and more particularly to a micro-electro-mechanical system (MEMS) microphone.

Description of the Related Art

The current tendency is toward fabricating slim, compact, lightweight and high-performance electronic devices, including microphones. A microphone is used to receive sound waves and convert acoustic signals into electric signals. Microphones are widely used in daily life and are installed in such electronic products as telephones, mobiles phones, and recording pens. In a capacitive microphone, variations in acoustic pressure (i.e. local pressure deviation from the ambient atmospheric pressure caused by sound waves) force the diaphragm to deform correspondingly, and the deformation of the diaphragm induces a capacitance variation. The variation of acoustic pressure of the sound waves can thus be obtained by detecting the voltage difference caused by the capacitance variation.

This is distinct from the conventional electret condenser microphones (ECM), in which mechanical and electronic elements of micro-electro-mechanical system (MEMS) microphones can be integrated on a semiconductor material using integrated circuit (IC) technology to fabricate a miniature microphone. MEMS microphones have such advantages as a compact size, being lightweight, and having low power consumption, and they have therefore entered the mainstream of miniaturized microphones.

Although existing MEMS microphones have generally been adequate for their intended purposes, they have not been entirely satisfactory in all respects. For example, the compatible acoustic pressure range (i.e. dynamic range) of detectable sound waves in a MEMS microphone still needs improvement. The dynamic range is related to the highest compatible acoustic pressure (i.e. acoustic overload point, which is referred to hereinafter as the "AOP"), which is determined by the harmonic distortion rate (total harmonic distortion, which is referred to hereinafter as the "THD") of the MEMS microphone. On the other hand, if the diaphragm has a lower elastic modulus (i.e. lower stiffness), it can be used to sense a smaller acoustic pressure (i.e. have higher sensitivity), but the THD of the diaphragm will be sacrificed accordingly (i.e. the AOP will be reduced). Therefore, it cannot achieve high AOP and high sensitivity, simultaneously, of a MEMS microphone (i.e. unable to achieve a wider dynamic range).

BRIEF SUMMARY OF THE INVENTION

In view of the aforementioned problems, an object of the invention is to provide a MEMS microphone that can achieve high AOP and high sensitivity simultaneously.

An embodiment of the invention provides a MEMS microphone. The MEMS microphone A micro-electro-mechanical system (MEMS) microphone is provided. The MEMS microphone includes a substrate, a backplate disposed on a side of the substrate, a diaphragm movably disposed between the substrate and the backplate, and a plurality of slots formed on the diaphragm. The slots are spaced apart from each other and have a non-constant width to relieve the residual stress on the diaphragm.

In some embodiments, at least one of the slots forms a main body and two end portions extending from the main body toward the outside or the inside of the diaphragm.

In some embodiments, the slots include a plurality of outer slots and a plurality of inner slots arranged in concentric circles, and the outer slots respectively form a main body and two end portions extending from the main body toward the outside or the inside of the diaphragm.

In some embodiments, the outer slots respectively define a central line, and the end portions of the outer slots respectively define a center, wherein the centers of the end portions are located on a circle, and the central lines are tangent to the circle.

In some embodiments, the slots includes a plurality of outer slots and a plurality of inner slots arranged in concentric circles, and the inner slots respectively form a main body and two end portions extending from the main body toward the outside or the inside of the diaphragm.

In some embodiments, the inner slots respectively define a central line, and the end portions of the inner slots respectively define a center, wherein the centers of the end portions are located on a circle, and the central lines are tangent to the circle.

In some embodiments, the slots are arranged in concentric circles and respectively form a main body and two end portions extending from the main body toward the outside of the diaphragm.

In some embodiments, the slots are arranged in concentric circles and respectively forms a main body and two end portions extending from the main body toward the inside of the diaphragm.

In some embodiments, the slots include a plurality of outer slots and a plurality of inner slots arranged in concentric circles, the outer slots respectively form a first end portion, and the inner slots respectively form a second end portion, wherein the first and second end portions extend in opposite directions.

In some embodiments, the slots respectively form a main body and an end portion extending from the main body, and the end portion has a width greater than the main body.

BRIEF DESCRIPTION OF THE DRAWINGS

The invention can be more fully understood by reading the subsequent detailed description and examples with references made to the accompanying drawings, wherein:

FIG. 5C is a schematic diagram showing another embodiment of the slots 141 configured in concentric circles around the center C of the diaphragm 14.

FIG. 5D is an enlarged view of the outer and inner slots P1 and P2 in FIG. 5C.

DETAILED DESCRIPTION OF THE INVENTION

Figure 1A:
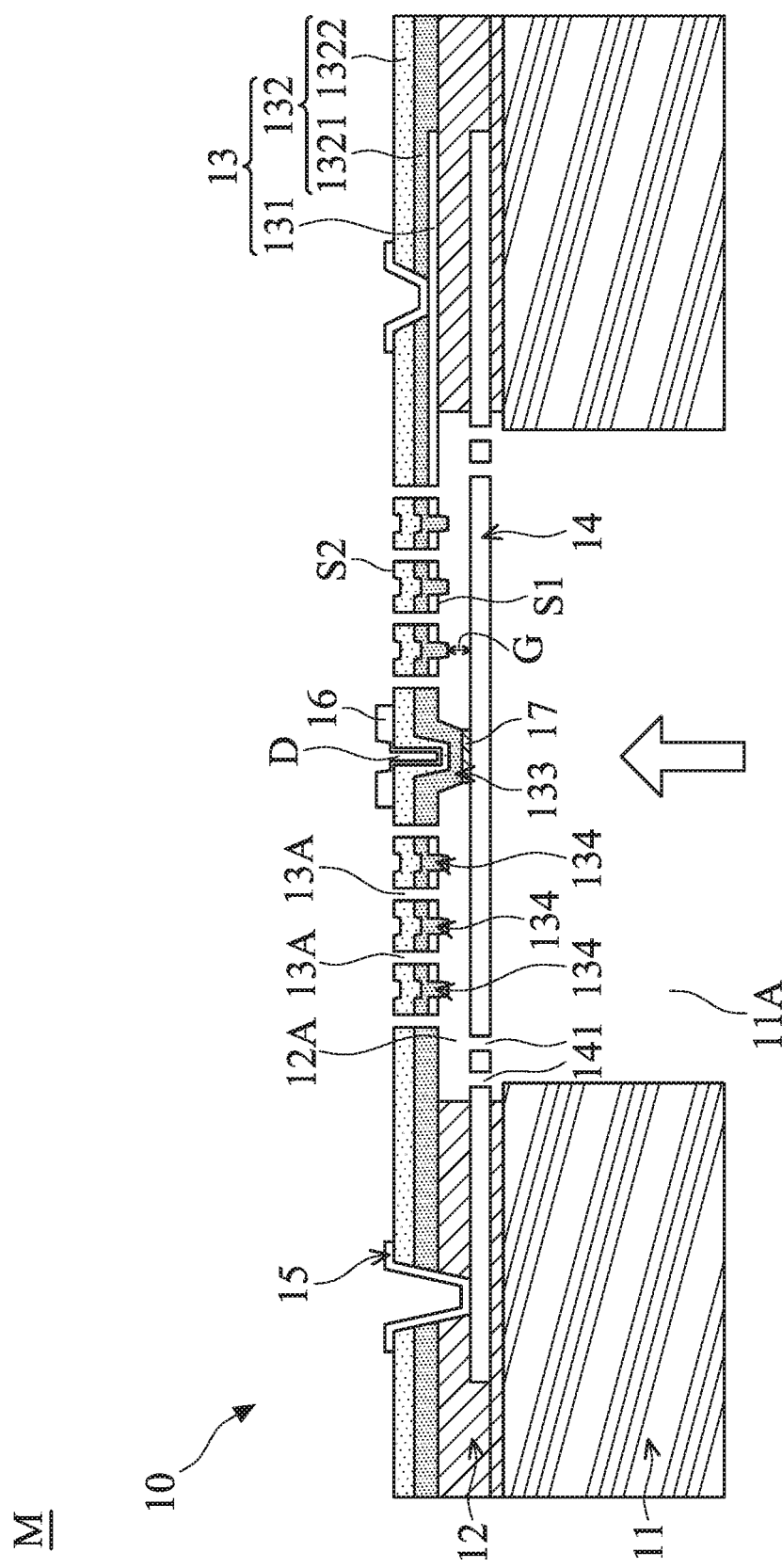
FIG. 1A schematically illustrates a cross-sectional view of a MEMS microphone, in accordance with some embodiments.

The following description is of the best-contemplated mode of carrying out the invention. This description is made for the purpose of illustrating the general principles of the invention and should not be taken in a limiting sense. The scope of the invention is best determined by reference to the appended claims.

In the following detailed description, the orientations of "on", "above", "under", and "below" are used for representing the relationship between the relative positions of each element as illustrated in the drawings, and are not meant to limit the invention. Moreover, the formation of a first element on or above a second element in the description that follows may include embodiments in which the first and second elements are formed in direct contact, or the first and second elements have one or more additional elements formed therebetween.

In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity. Furthermore, some elements not shown or described in the embodiments have the forms known by persons skilled in the field of the invention.

In the present disclosure, a micro-electro-mechanical system (MEMS) microphone for detecting sound waves and converting the sound waves (acoustic signal) into electric signal is provided, in accordance with various exemplary embodiments. In particular, the MEMS microphones in the various embodiments can achieve high AOP (i.e. achieve a wider dynamic range) and high sensitivity simultaneously via the following described features. The variations of some embodiments are discussed. Throughout the various views and illustrative embodiments, like reference numbers are used to designate like elements.

FIG. 1A schematically illustrates a cross-sectional view of a MEMS microphone M, in accordance with some embodiments. It should be noted that the MEMS microphone M depicted in FIG. 1A has been simplified for the sake of clarity to better understand the inventive concepts of the present disclosure. Additional features can be added into the MEMS microphone M, and some of the features described below can be replaced or eliminated in other embodiments of the MEMS microphone M. As shown in FIG. 1A, the MEMS microphone M which is a capacitive microphone includes a MEMS structure 10 including a substrate 11, a dielectric layer 12, a backplate 13, a diaphragm 14, and an electrode layer 15.

The substrate 11 is configured to support the dielectric layer 12, the backplate 13, the diaphragm 14, and the electrode layer 15 on a side thereof. The substrate 11 may have an opening portion 11A which allows sound waves (e.g., as the arrow indicated in FIG. 1A) received by the MEMS microphone M to pass through and/or enter the MEMS structure 10. The substrate 11 may be made of silicon or the like.

The dielectric layer 12 is disposed between the substrate 11 and the diaphragm 14, and between the diaphragm 14 and the backplate 13, so as to provide partial isolation between the substrate 11, the diaphragm 14, and the backplate 13 from each other. Moreover, the dielectric layer 12 is disposed around the backplate 13 and the diaphragm 14, such that the backplate 13 and the diaphragm 14 are clamped at their edges by the dielectric layer 12. Furthermore, the dielectric layer 12 may have an opening portion 12A corresponding to the opening portion 11A of the substrate 11, so as to allow the sound waves to pass through the diaphragm 14 and the backplate 13 and then leave the MEMS structure 10. The dielectric layer 12 may be made of silicon oxide or the like.

The backplate 13 is a stationary element disposed on a side of the substrate 11. The backplate 13 may have sufficient stiffness such that it would not be bent or movable when the sound waves pass through the backplate 13. In some embodiments, the backplate 13 is a stiff perforated element including a number of acoustic holes 13A each passing through the backplate 13, as shown in FIG. 1A. The acoustic holes 13A are configured to allow the sound waves to pass through.

In some embodiments, the backplate 13 includes a conductive layer 131 and an insulating layer 132 covering the conductive layer 131 for protection, as shown in FIG. 1A.

The conductive layer 131 and the insulating layer 132 are respectively located on a first side S1 of the backplate 13 facing the diaphragm 14 and a second side S2 of the backplate 13 opposite to the first side S1. The conductive layer 131 may be made of poly-silicon or the like, and the insulating layer 132 may be made of silicon nitride or the like.

In some embodiments, the MEMS structure 10 is electrically connected to a circuit (not shown) via several electrode pads of the electrode layer 15 that is disposed on the backplate 13 and electrically connected to the conductive layer 131 and the diaphragm 14. In some embodiments, the electrode layer 15 comprises copper, silver, gold, aluminum, or alloy thereof.

The diaphragm 14 is movable or displaceable relative to the backplate 13. The diaphragm 14 is configured to sense the sound waves received by the MEMS microphone M.

The displacement change of the diaphragm 14 relative to the backplate 13 causes a capacitance change between the diaphragm 14 and the backplate 13. The capacitance change is then converted into an electric signal by a circuitry connected with the diaphragm 14 and the backplate 13, and the electrical signal is sent out of the MEMS microphone M through the electrode layer 15.

In some embodiments, a first insulating protrusion 133 is provided or formed on the first side S1 of the backplate 13 facing the diaphragm 14, and the first insulating protrusion 133 is connected to and affixed to the diaphragm 14 permanently, as shown in FIG. 1A. In some embodiments, the first insulating protrusion 133 is integrally formed with the insulating layer 132 and protrudes toward the diaphragm 14. The first insulating protrusion 133 may be a solid column connecting the backplate 13 and (e.g. the center of) the diaphragm 14, so that the first insulating protrusion 133 supports the diaphragm 14 to increase stiffness of the diaphragm 14, thereby increasing the AOP of the MEMS Microphone M.

In some embodiments, an additional insulating layer 17 is also provided and connected between the first insulating protrusion 133 and the diaphragm 14, as shown in FIG. 1A. The additional insulating layer 17 may include the same material as the dielectric layer 12 or another insulating material. However, the additional insulating layer 17 can be omitted in different embodiments.

On the other hand, in order to increase the sensitivity of the diaphragm 14, a number of long slots 141 may be provided in the diaphragm 14. In some embodiments, the long slots 141 in the diaphragm 14 are arranged in concentric circles close to the dielectric layer 12 (e.g., between the conductive layer 131 of the backplate 13 and the dielectric layer 12) and the long slots of adjacent circles are arranged alternately (see FIGS. 1 and 2A), so that the long slots 141 can serve as a spring in the diaphragm 14 to reduce the stiffness of the diaphragm 14. In some alternative embodiments, the number of concentric circles formed by the long slots 141 may be more than two. With this structural feature, high sensitivity of the MEMS microphone M can be achieved.

In addition, the long slots 141 in the diaphragm 14 are also configured to relieve the stress on the diaphragm 14.

In some embodiments, a number of second insulating protrusions 134 are also provided or formed on the first side S1 of the backplate 13, and an air gap G is formed between the diaphragm 14 and each of the second insulating protrusions 134, as shown in FIG. 1A. In addition, the air gap G between the diaphragm 14 and each of the second insulating protrusions 134 may be the same (but not limited thereto).

Still referring to FIG. 1A, to form the first insulating protrusion 133 and the second insulating protrusions 134, the insulating layer 132 of the backplate 13 may include a first insulating layer 1321 and a second insulating layer 1322 stacked on the first insulating layer 1321. In some embodiments, the first and second insulating layers 1321 and 1322 may comprise the same material or different material. In some embodiments, a protection layer 16 is provided to cover a recess D that is formed on the second side S2 and corresponding to the first insulating protrusion. The protection layer 16 may comprise conductive material (e.g., aluminum) or another material.

Figure 1B:
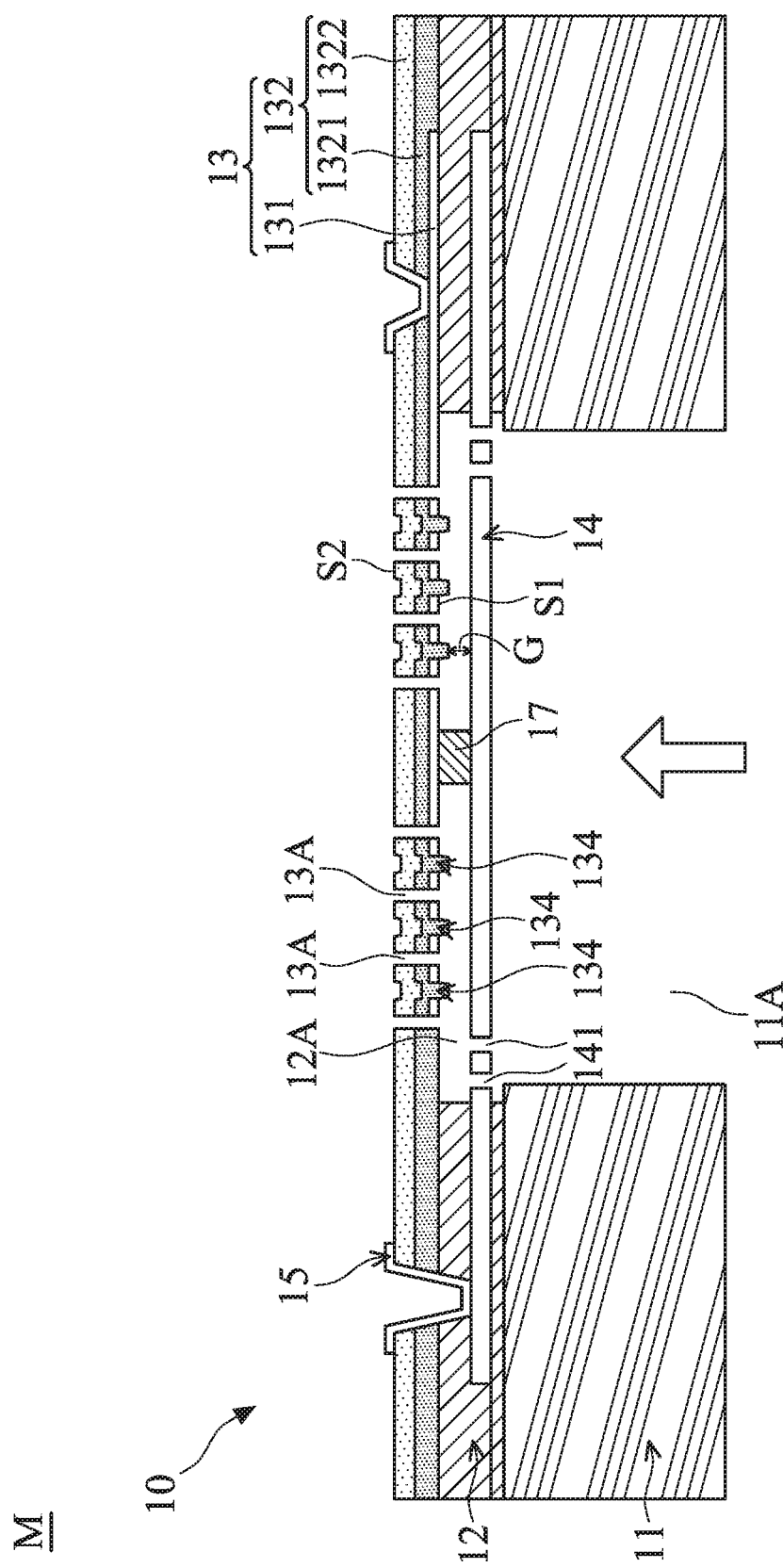
FIG. 1B schematically illustrates a cross-sectional view of a MEMS microphone, in accordance with another embodiment of the invention.

FIG. 1B schematically illustrates a cross-sectional view of a MEMS microphone M, in accordance with another embodiment of the invention. Referring to FIG. 1B, the first insulating protrusion 133 depicted in FIG. 1A can be omitted form the backplate 13, and the additional insulating layer 17 described above is provided and connected between the first side S1 of the backplate 13 and the diaphragm 14, so as to support the center region of the diaphragm and increase the AOP of the diaphragm.

Figure 1C:
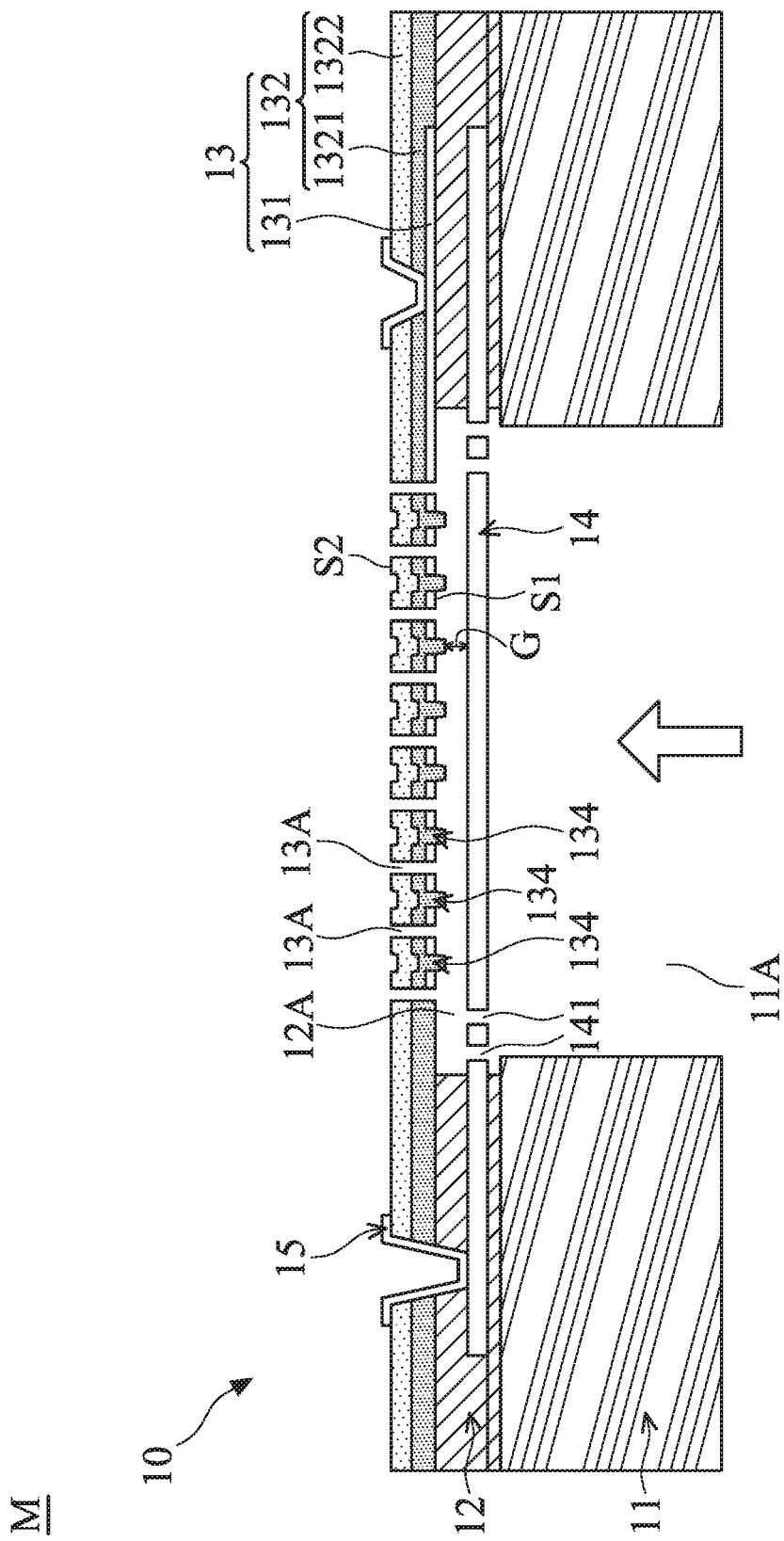
FIG. 1C schematically illustrates a cross-sectional view of a MEMS microphone, in accordance with another embodiment of the invention.

FIG. 1C schematically illustrates a cross-sectional view of a MEMS microphone M, in accordance with another embodiment of the invention. As shown in FIG. 1C, the additional insulating layer 17 depicted in FIGS. 1A and 1B can be omitted from the MEMS microphone M.

Figure 2A:
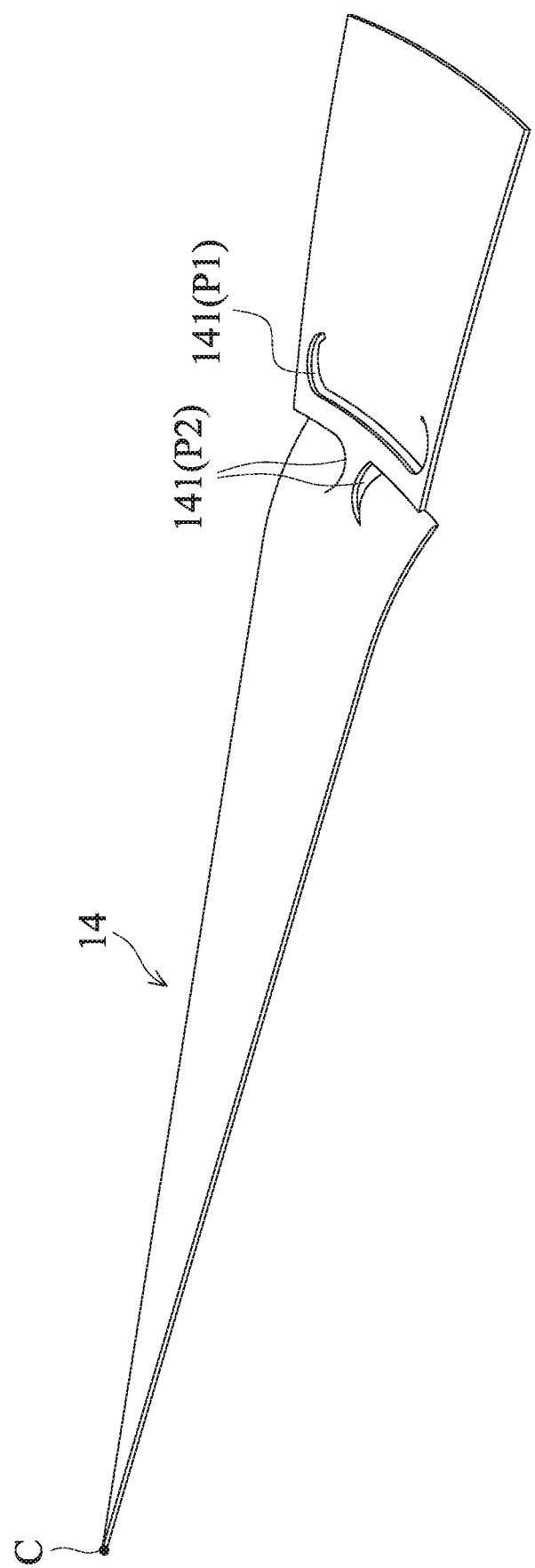
FIGS. 2A and 2B are perspective diagrams showing a fan-shaped part of the diaphragm 14 in FIG. 1A, 1B, or 1C.
Figure 2B:
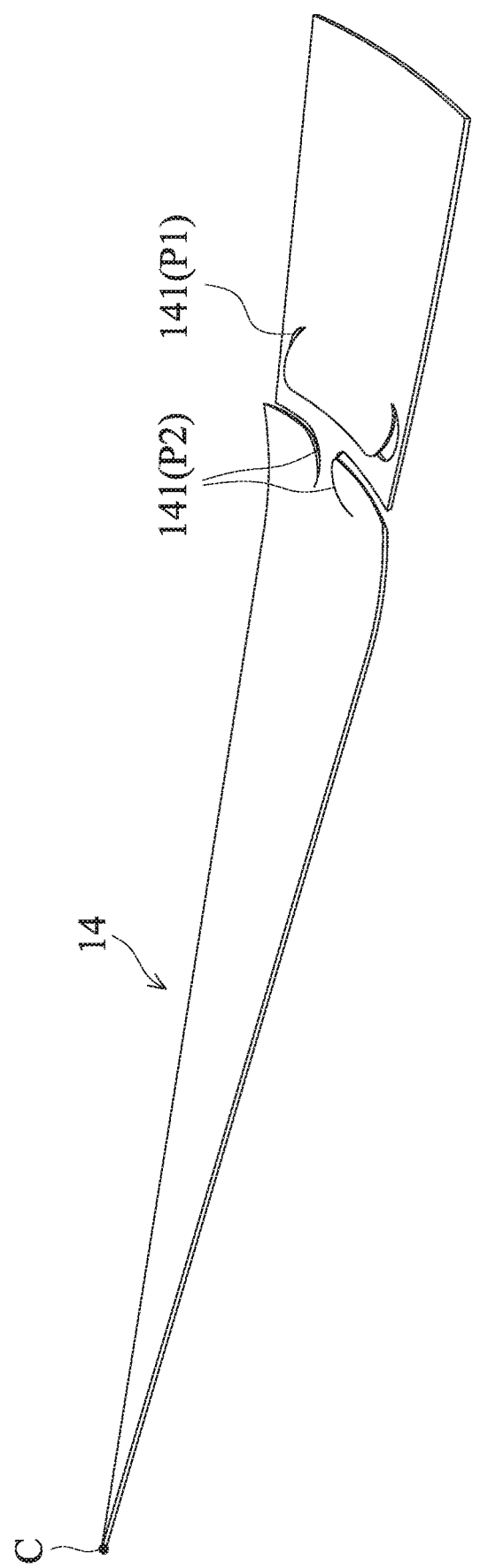

FIGS. 2A and 2B are perspective diagrams showing a fan-shaped part of the diaphragm 14 in FIG. 1A, 1B, or 1C. Referring to FIGS. 2A and 2B, the diaphragm 14 in this embodiment has a thin circular structure, wherein the long slots 141 includes a plurality of outer and inner slots P1 and P2 arranged around the center C of the diaphragm 14. When the diaphragm 14 is affected by acoustic pressure form ambient sound waves, air can flow downward (FIG. 2A) or upward (FIG. 2B) through the slots 141 to relieve the residual stress and endure the wind load on the diaphragm 14.

Figure 3A:
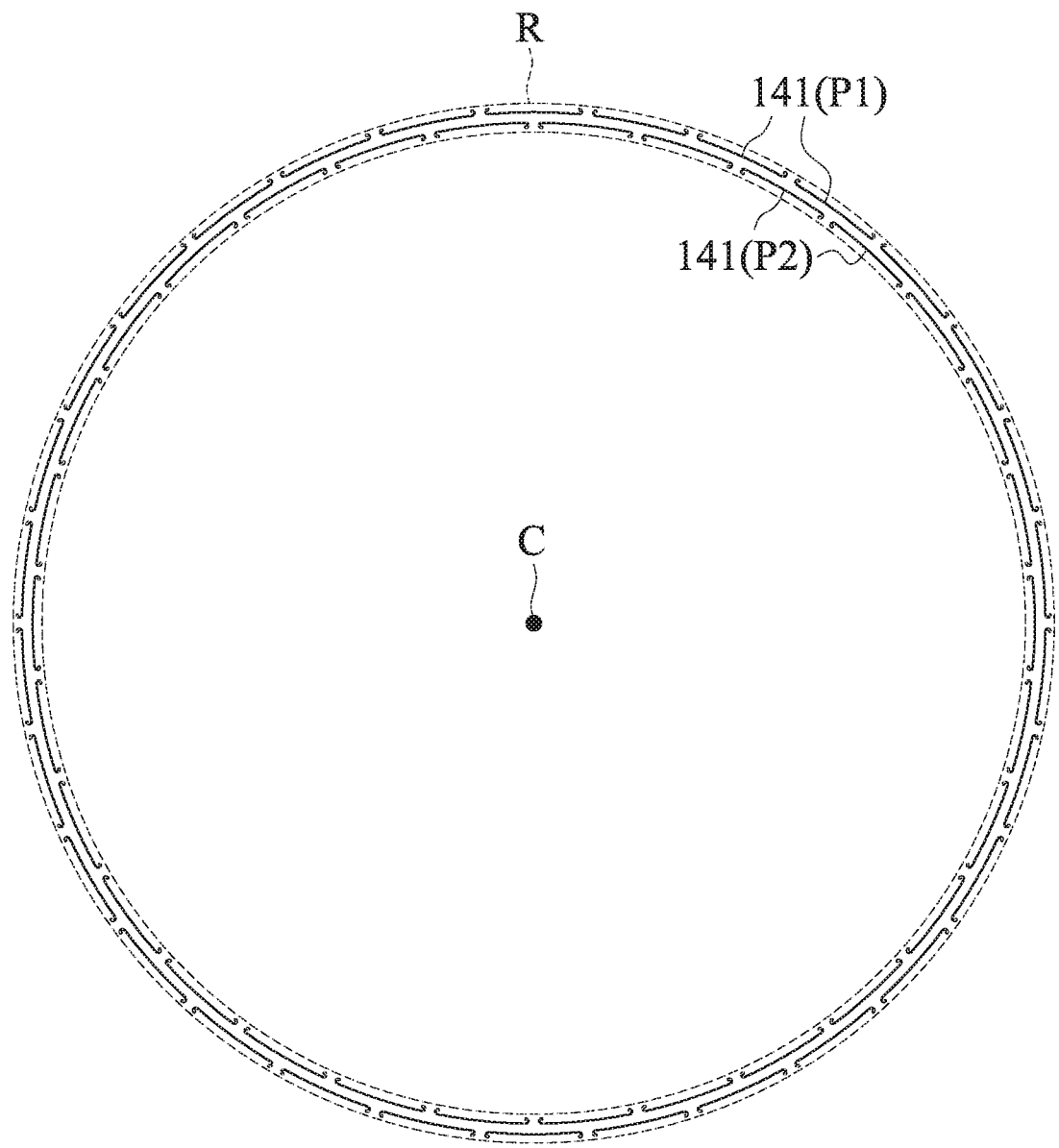
FIG. 3A is a schematic diagram showing the slots 141 arranged around the center C of the diaphragm 14, in accordance with an embodiment of the invention.
Figure 3C:
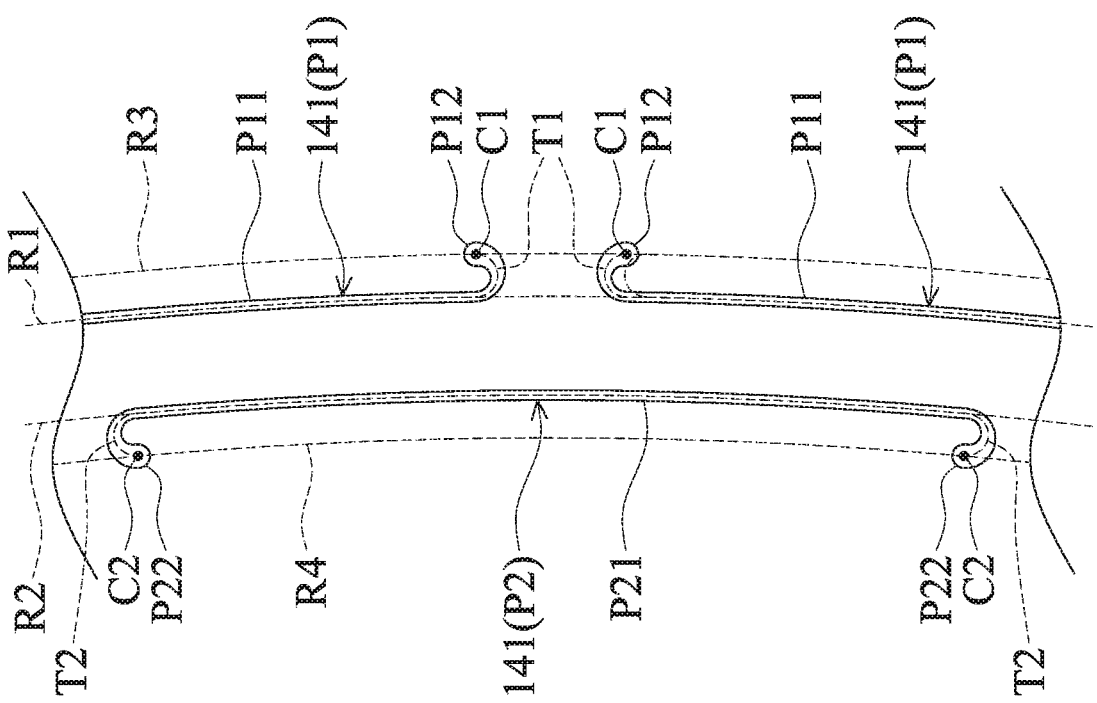
FIG. 3C is a further enlarged view of the outer and inner slots P1 and P2 in FIG. 3B.
Figure 3B:
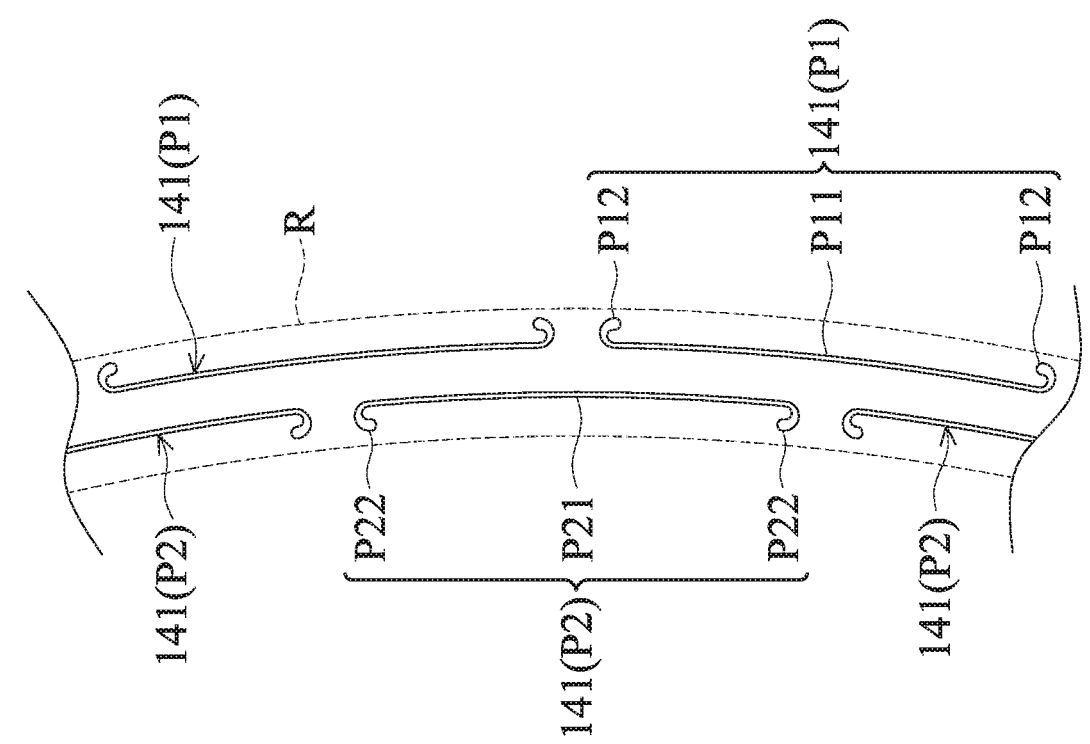
FIG. 3B is an enlarged view of the outer and inner slots P1 and P2 in FIG. 3A.

FIG. 3A is a schematic diagram showing the slots 141 arranged around the center C of the diaphragm 14, in accordance with an embodiment of the invention. FIG. 3B is an enlarged view of the outer and inner slots P1 and P2 in FIG. 3A. FIG. 3C is a further enlarged view of the outer and inner slots P1 and P2 in FIG. 3B.

Referring to FIGS. 3A-3C, the outer and inner slots P1 and P2 are located within an annular area R of the diaphragm 14, and they are configured in concentric circles around the center C of the diaphragm 14. Moreover, the outer and inner slots P1 and P2 are arranged in a staggered manner with respect to the center C of the diaphragm 14, wherein each outer slot P1 forms a main body P11 and two end portions P12 extending from the main body P11 toward the outside of the diaphragm 14, and each inner slot P2 forms a main body P21 and two end portions P22 extending from the main body P21 toward the inside of the diaphragm 14.

As depicted in FIG. 3C, the main bodies P11 of the outer slots P1 are arranged along a circle R1, and the main bodies P21 of the inner slots P2 are arranged along another circle R2 that is coaxial with the circle R1. Additionally, the end portions P12 of the outer slots P1 respectively define a center C1, and the centers C1 are located on a circle R3. Similarly, the end portions P22 of the inner slots P2 respectively define a center C2, and the centers C2 are located on a circle R4 that is coaxial with the circles R1-R3.

Figure 3D:
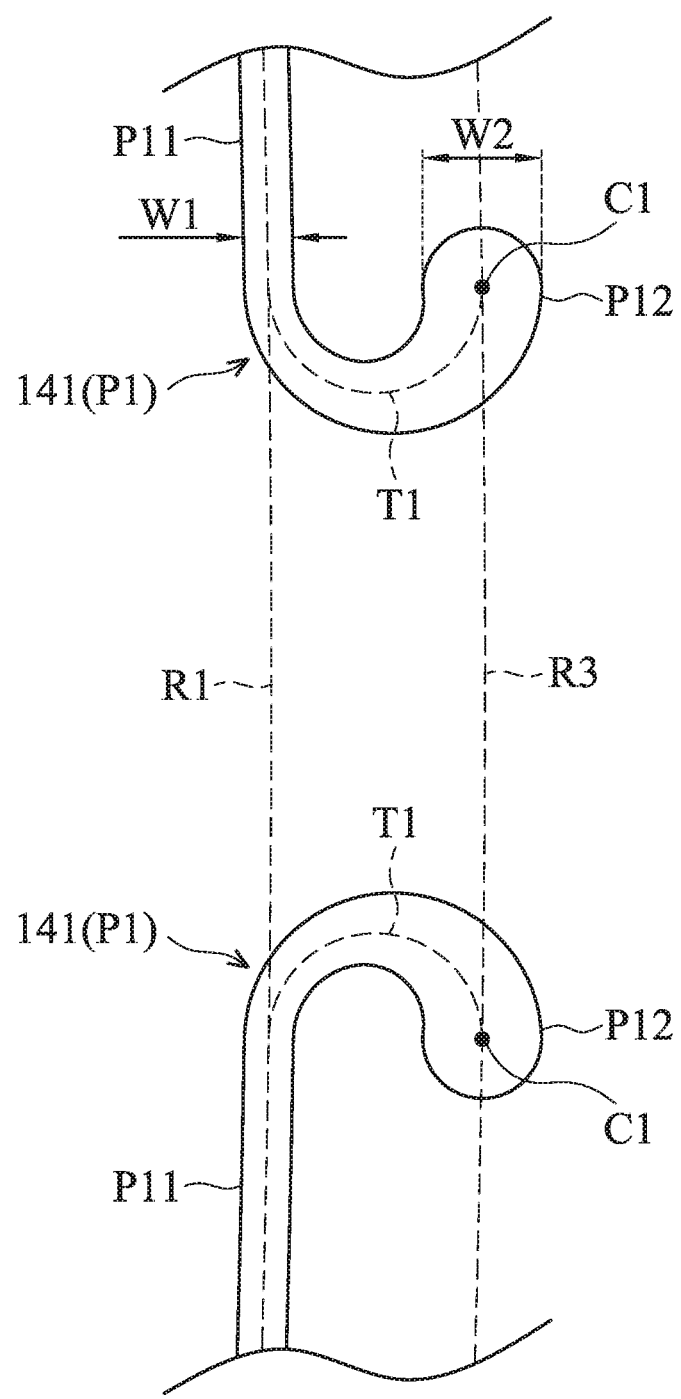
FIG. 3D is a schematic diagram showing the main body P11 and the end portion P12 of each outer slot P1 in FIG. 3C form a crutch-shaped structure.

It should be noticed that the main body P11 and the end portion P12 of each outer slot P1 can form a crutch-shaped structure (FIG. 3D), wherein the end portion P12 has a curved edge. Specifically, each outer slot P1 defines a central line T1 extending through the centers C1 of the end portions P12, and the central line T1 is tangent to the circle R3 where the centers C1 of the end portions P12 are located. Here, the main body P11 has a minimum width W1 of the outer slot P1, and the end portion P12 has a maximum width W2 of the outer slot P1, wherein the width of the outer slot P1 gradually increases from the main body P11 to the end portion P12. With the non-constant width of the outer slots P1, the residual stress on the diaphragm 14 can be efficiently relieved.

Similarly, the main body P21 and the end portion P22 of each inner slot P2 can form a crutch-shaped structure (FIGS. 3B and 3C), wherein the end portion P12 has a curved edge. Here, each inner slot P2 defines a central line T2 extending through the centers C2 of the end portions P22, wherein the central line T2 of the inner slot P2 is tangent to the circle R4 (FIG. 3C). It should be noted that the main body P11 has a minimum width of the inner slot P2, the end portion P12 has a maximum width of the inner slot P2, and the width of the inner slot P2 gradually increases from the main body P21 to the end portion P22. Since the outer and inner slots P1 and P2 both have a non-constant width, a better residual stress relief of the diaphragm 14 can be therefore achieved.

Figure 4A:
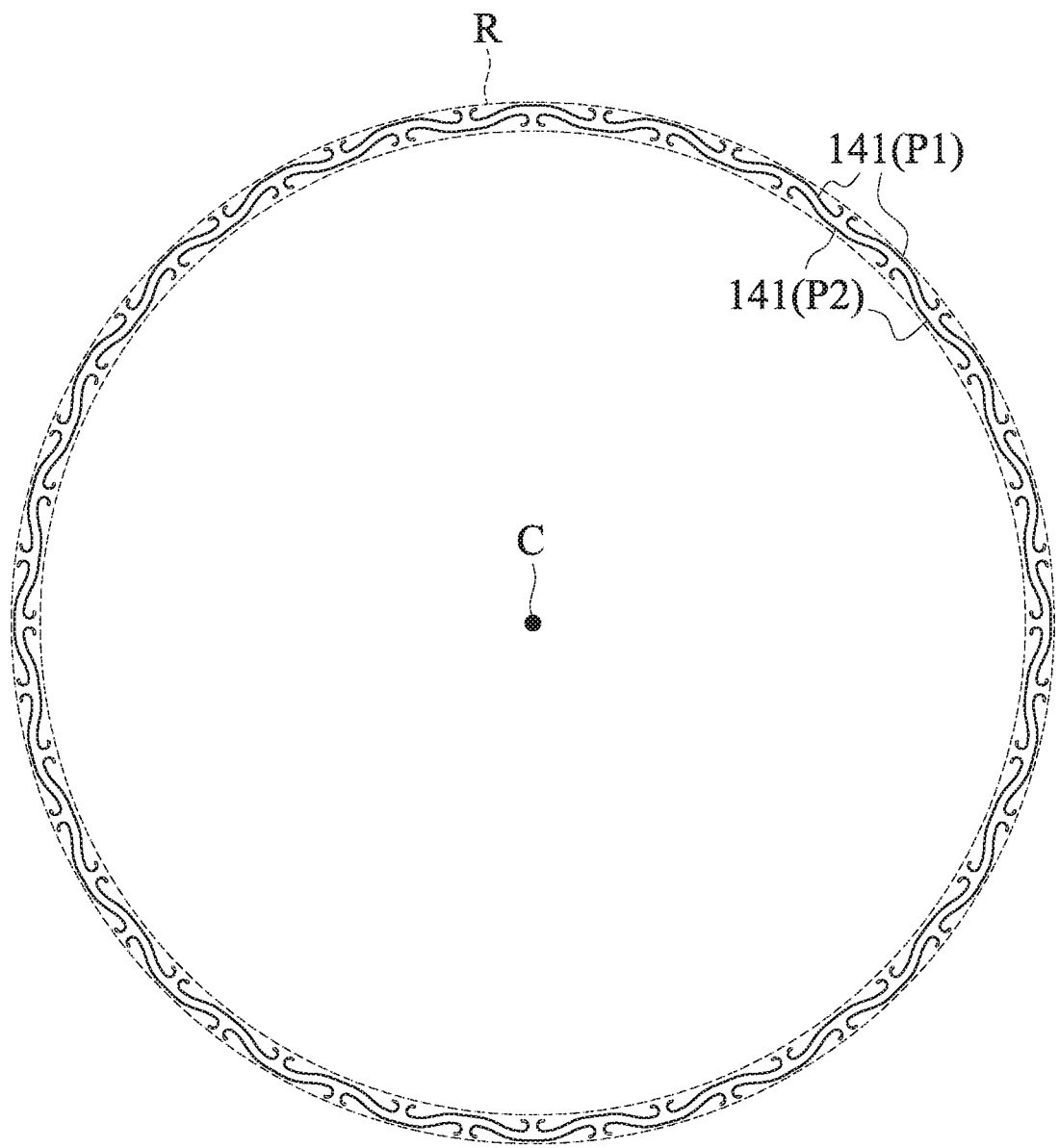
FIG. 4A is a schematic diagram showing another embodiment of the slots 141 configured in concentric circles around the center C of the diaphragm 14.
Figure 4C:
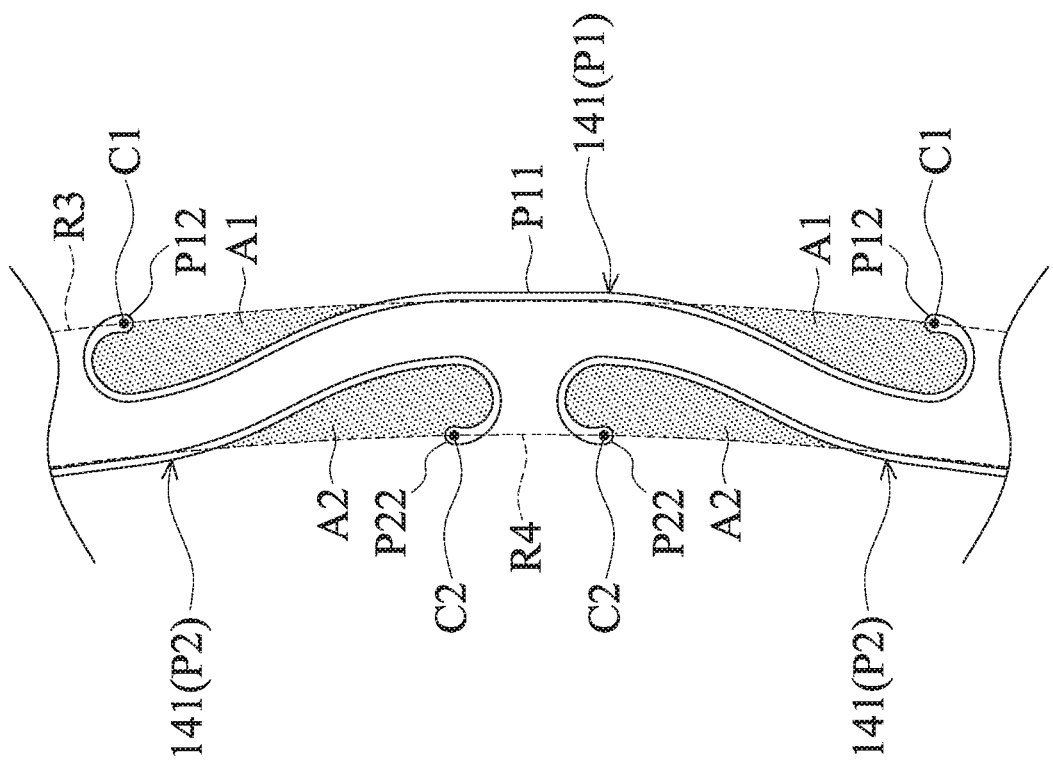
FIG. 4C is a further enlarged view of the outer and inner slots P1 and P2 in FIG. 4B.
Figure 4B:
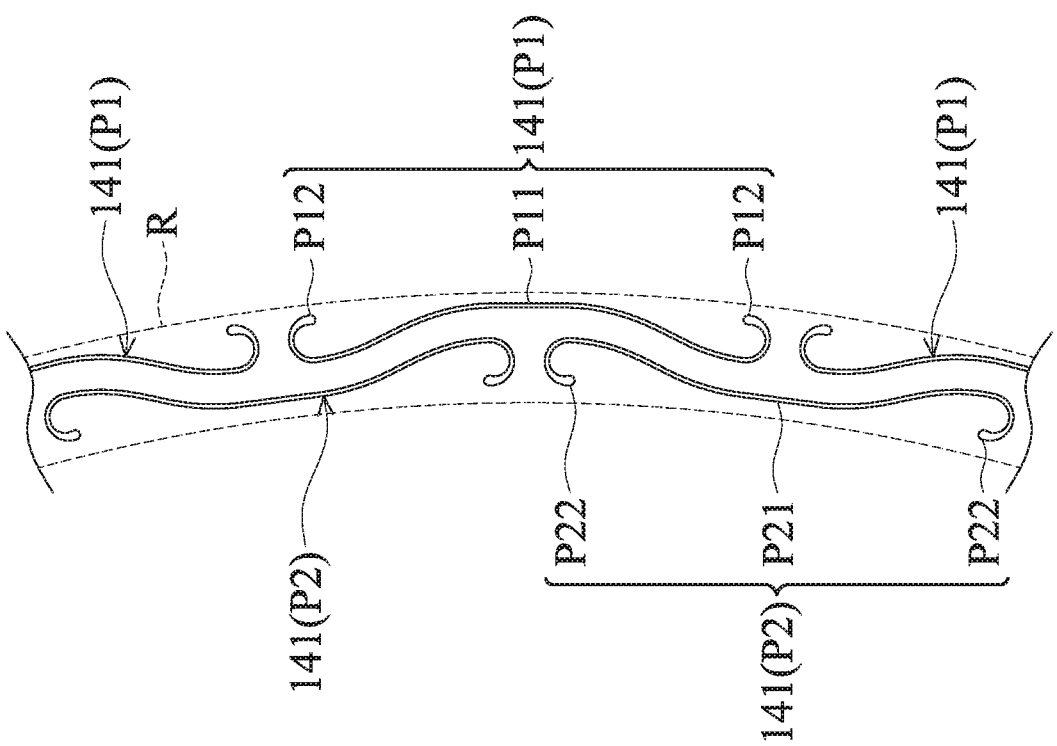
FIG. 4B is an enlarged view of the outer and inner slots P1 and P2 in FIG. 4A.

FIG. 4A is a schematic diagram showing another embodiment of the slots 141 configured in concentric circles around the center C of the diaphragm 14. FIG. 4B is an enlarged view of the outer and inner slots P1 and P2 in FIG. 4A. FIG. 4C is a further enlarged view of the outer and inner slots P1 and P2 in FIG. 4B.

Referring to FIGS. 4A-4C, the slots 141 in this embodiment is different from FIGS. 3A-3D in that the main bodies P11 and P21 of the outer and inner slots P1 and P2 have a meandering structure. Here, two droplet-shaped concave areas A1 are formed by the main body P11 and the end portions P12 of each outer slot P1, wherein the concave areas A1 have an opening toward the outside of the diaphragm 14. Similarly, two droplet-shaped concave areas A2 are formed by the main body P21 and the end portions P22 of each inner slot P2, wherein the concave areas A2 have an opening toward the inside of the diaphragm 14, so as to relieve the residual stress and endure the wind load on the diaphragm 14.

Figures 5A, 5B:
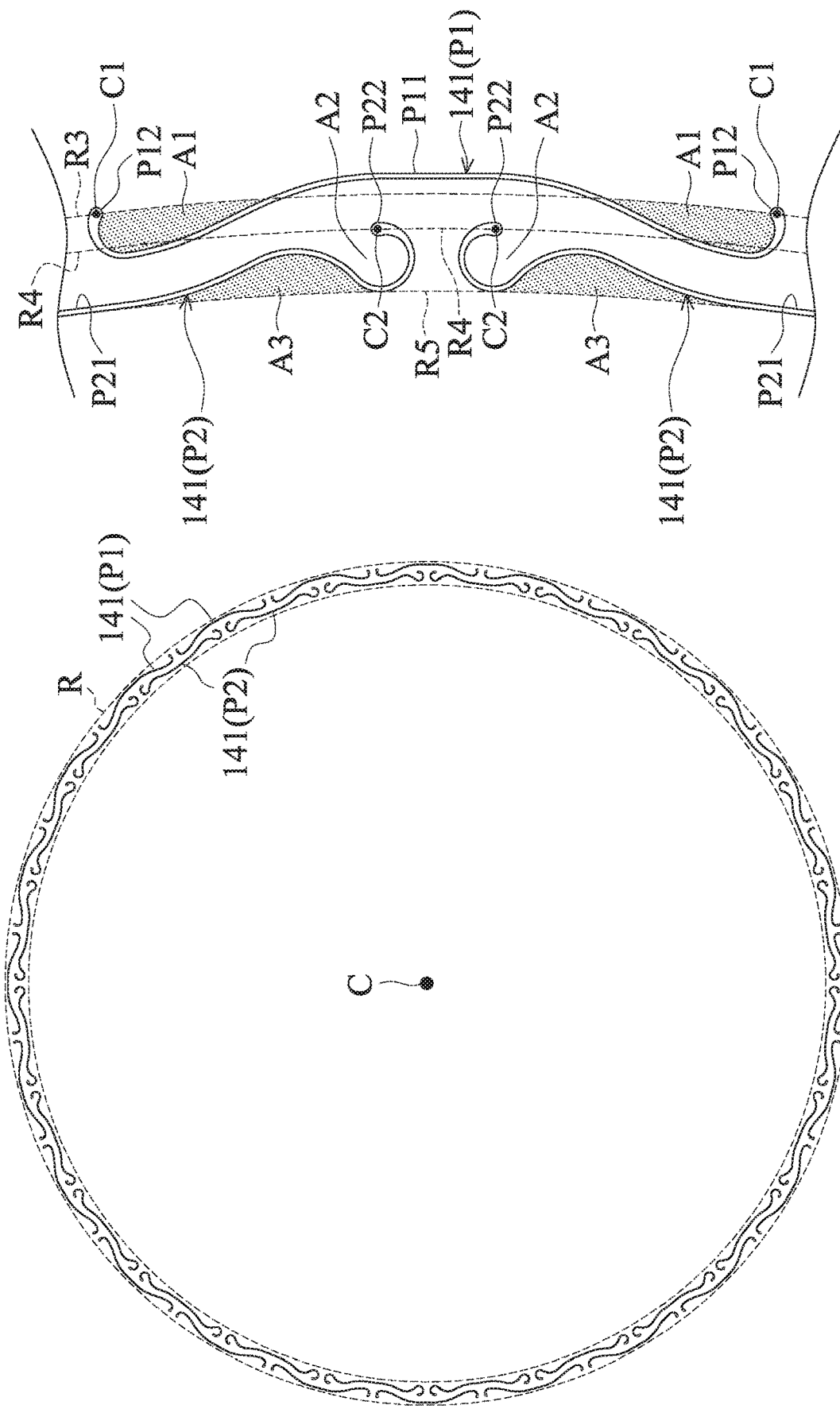
FIG. 5A is a schematic diagram showing another embodiment of the slots 141 configured in concentric circles around the center C of the diaphragm 14.
FIG. 5B is an enlarged view of the outer and inner slots P1 and P2 in FIG. 5A.

FIG. 5A is a schematic diagram showing another embodiment of the slots 141 configured in concentric circles around the center C of the diaphragm 14. FIG. 5B is an enlarged view of the outer and inner slots P1 and P2 in FIG. 5A.

Referring to FIGS. 5A and 5B, the slots 141 of this embodiment are different from FIGS. 4A-4D in that the main bodies P11 and P21 of the outer and inner slots P1 and P2 have a more meandering structure. Here, two concave areas A1 are formed by the main body P11 and the end portions P12 of each outer slot P1, wherein the concave areas A1 both have an opening toward the outside of the diaphragm 14. Two concave areas A2 are formed by the main body P21 and the end portions P22 of each inner slot P2, and the concave areas A2 face toward the outer slots P1. Additionally, the main body P21 of each inner slot P2 forms two concave areas A3 facing the inside of the diaphragm 14, so as to efficiently relieve the residual stress and endure the wind load on the diaphragm 14. It should be noted that both of the circles R3 and R4 pass through the main bodies P11 of the outer slots P1, and the inner slots P2 are tangent to a circle R5 that is coaxial with the circles R3 and R4.

FIG. 5C is a schematic diagram showing another embodiment of the slots 141 configured in concentric circles around the center C of the diaphragm 14. FIG. 5D is an enlarged view of the outer and inner slots P1 and P2 in FIG. 5C.

Referring to FIGS. 5C-5D, the slots 141 of this embodiment is different from FIGS. 5A-5B in that the main bodies P21 of the inner slots P2 have a more meandering structure that forms two concave areas A3 facing the inside of the diaphragm 14. Moreover, two curved concave areas A2 are formed by the main body P21 and the end portions P22 of each inner slot P2, and the curved concave areas A2 both have an opening facing the outer slots P1, so as to efficiently relieve the residual stress on the diaphragm 14. It should be noted that the inner slots P2 are tangent to a circle R5 that is coaxial with the circles R3 and R4, and the circle R3 in this embodiment does not pass through the outer slots P1.

Figure 6A:
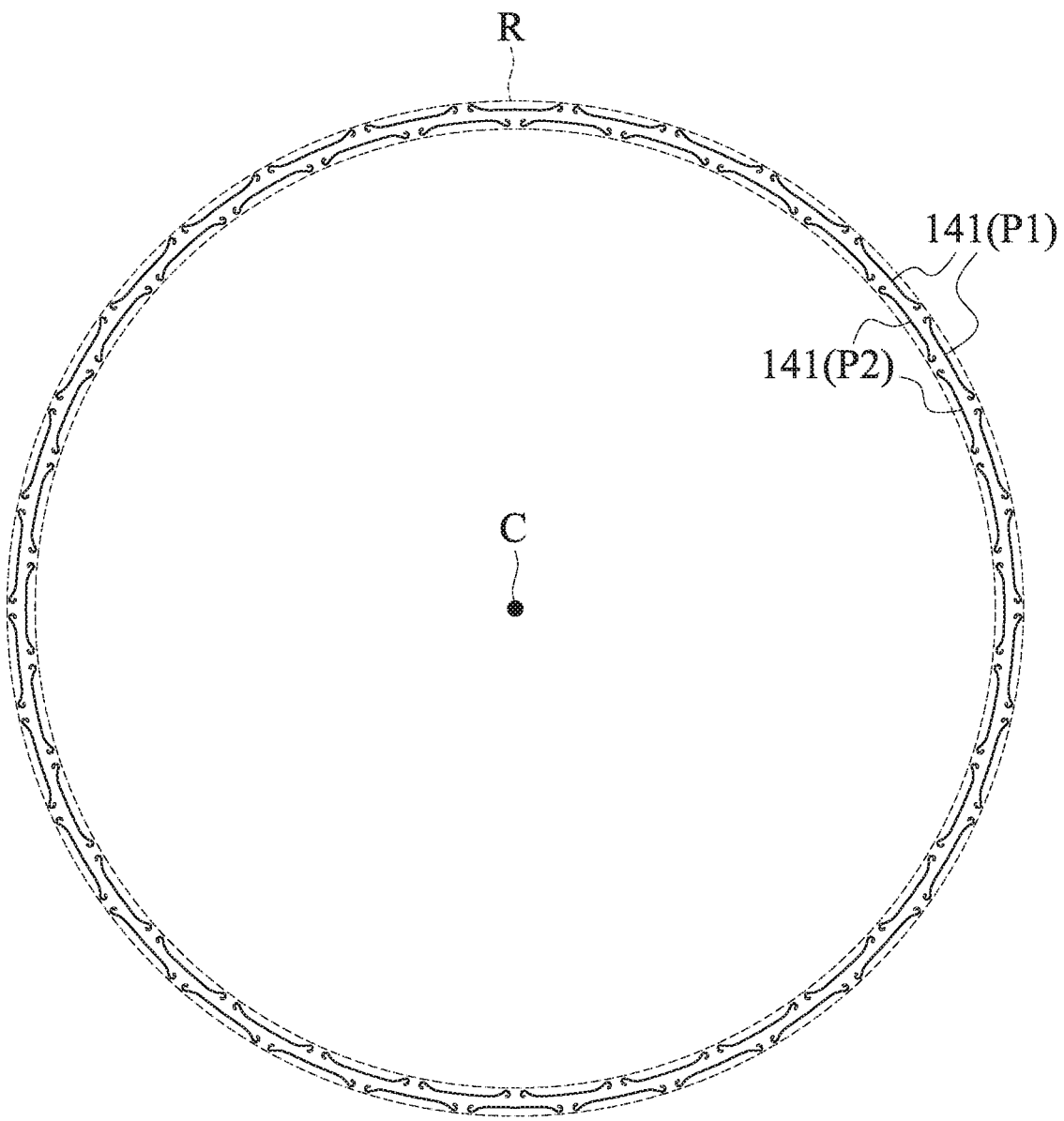
FIG. 6A is a schematic diagram showing another embodiment of the slots 141 configured in concentric circles around the center C of the diaphragm 14.
Figure 6C:
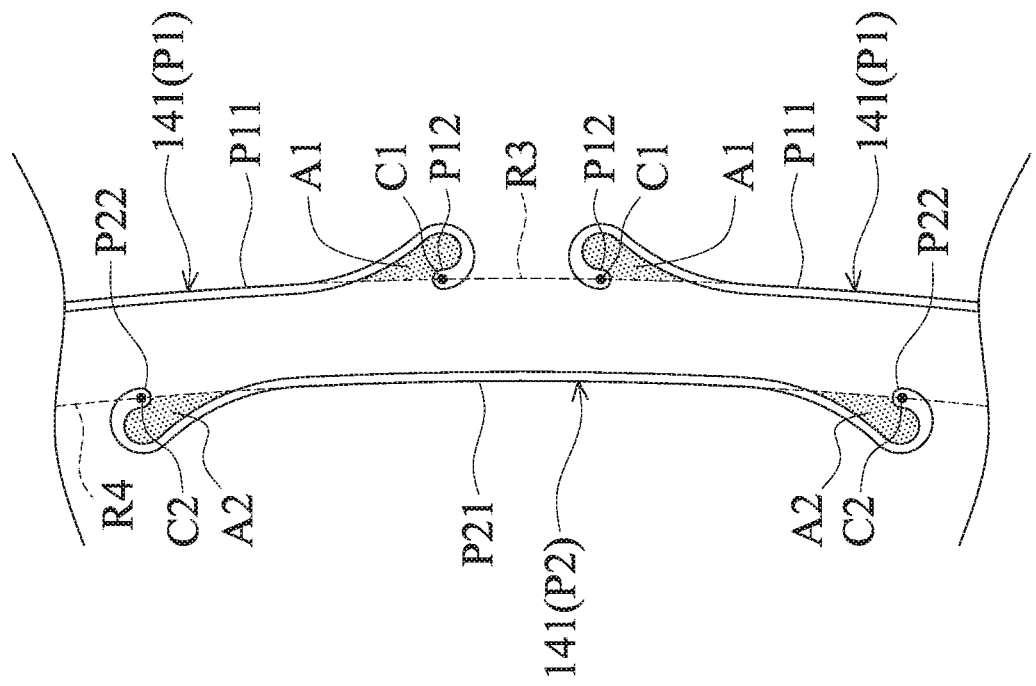
FIG. 6C is a further enlarged view of the outer and inner slots P1 and P2 in FIG. 6B.
Figure 6B:
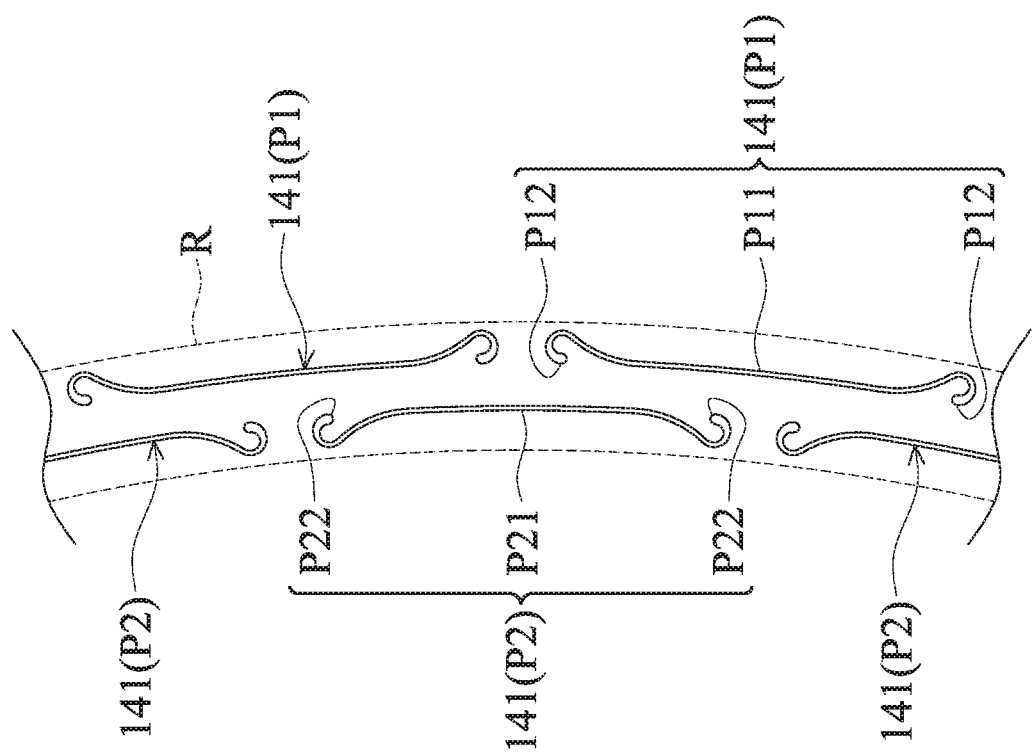
FIG. 6B is an enlarged view of the outer and inner slots P1 and P2 in FIG. 6A.

FIG. 6A is a schematic diagram showing another embodiment of the slots 141 configured in concentric circles around the center C of the diaphragm 14. FIG. 6B is an enlarged view of the outer and inner slots P1 and P2 in FIG. 6A. FIG. 6C is a further enlarged view of the outer and inner slots P1 and P2 in FIG. 6B.

Referring to FIGS. 6A-6C, the slots 141 of this embodiment is different from FIGS. 4A-4C in that two concave areas A1 are formed by the main body P11 and the end portions P12 of each outer slot P1, and two concave areas A2 are formed by the main body P21 and the end portions P22 of each inner slot P2. Here, the concave areas A1 have an opening facing the inner slots P2, and the concave areas A2 have an opening facing the outer slots P1, so as to efficiently relieve the residual stress on the diaphragm 14.

Figure 7A:
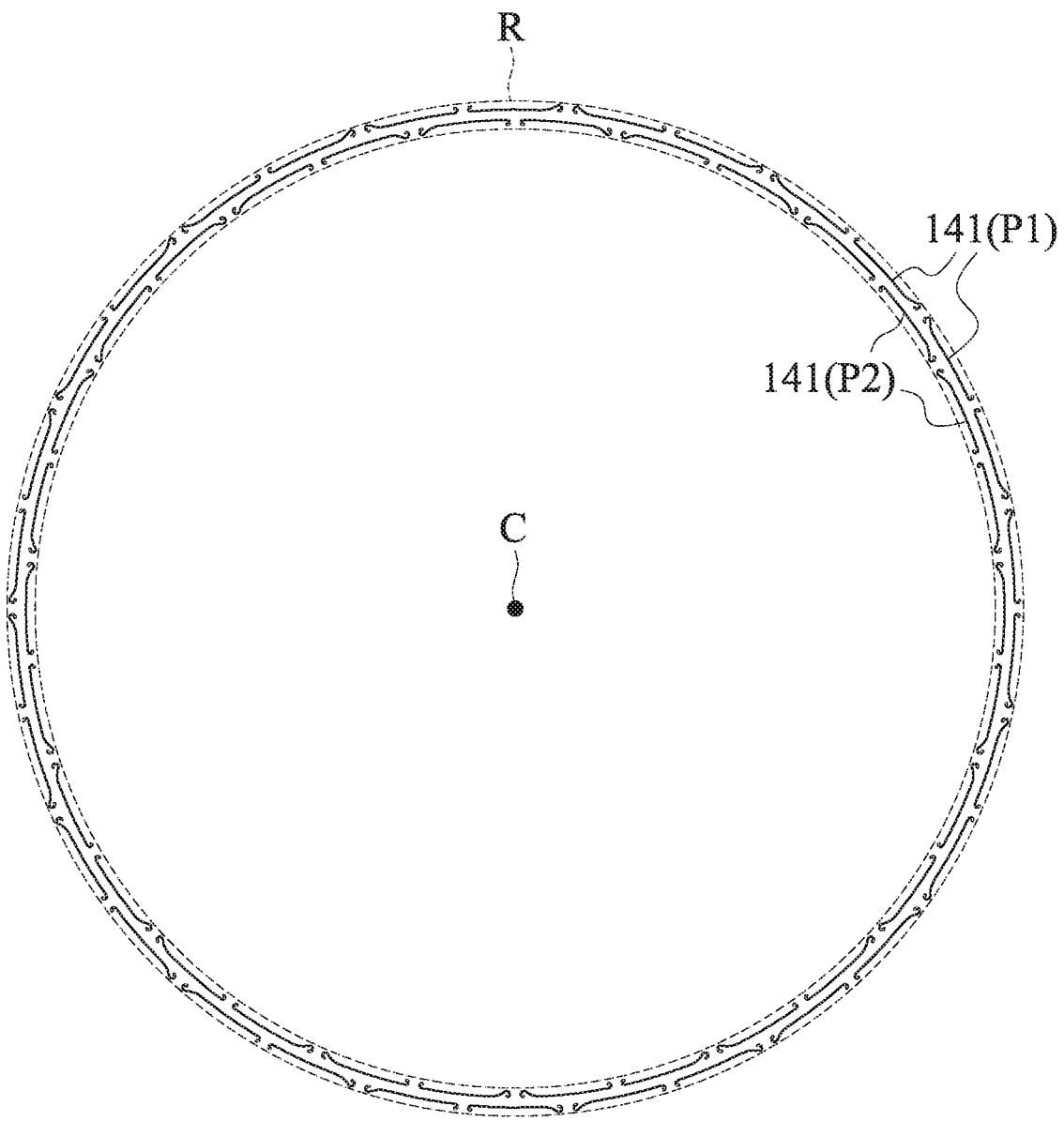
FIG. 7A is a schematic diagram showing another embodiment of the slots 141 configured in concentric circles around the center C of the diaphragm 14.
Figure 7C:
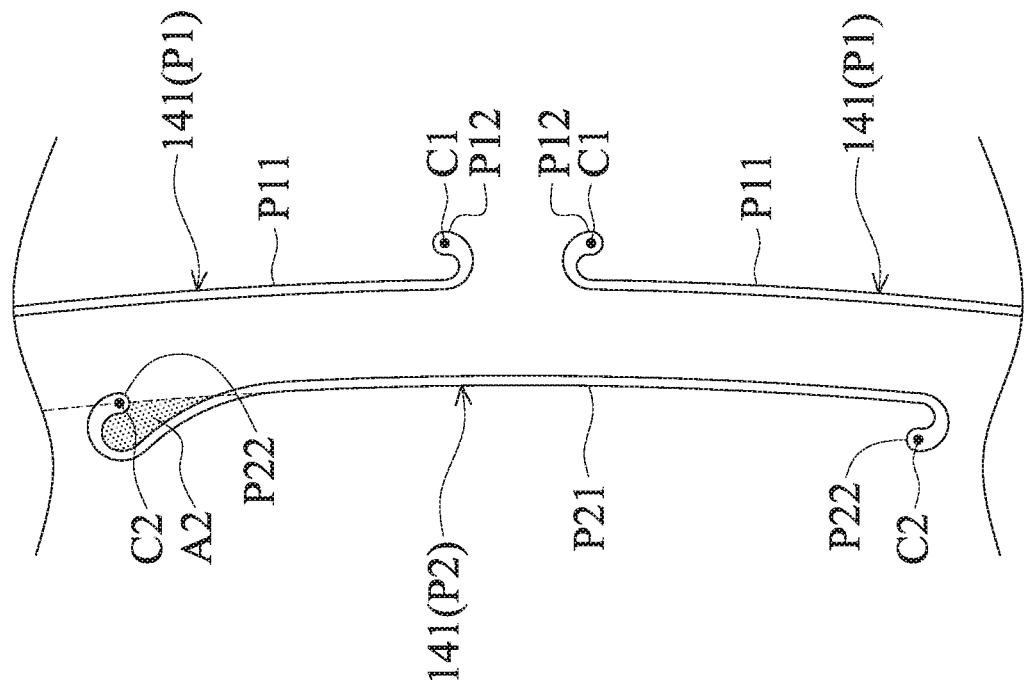
FIG. 7C is a further enlarged view of the outer and inner slots P1 and P2 in FIG. 7B.
Figure 7B:
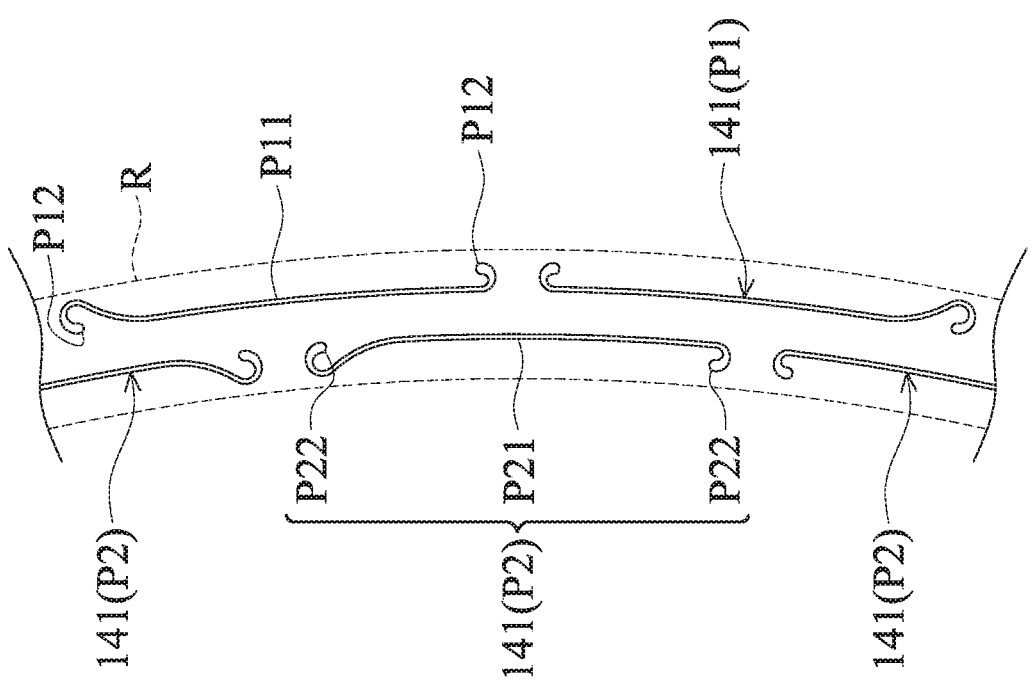
FIG. 7B is an enlarged view of the outer and inner slots P1 and P2 in FIG. 7A.

FIG. 7A is a schematic diagram showing another embodiment of the slots 141 configured in concentric circles around the center C of the diaphragm 14. FIG. 7B is an enlarged view of the outer and inner slots P1 and P2 in FIG. 7A. FIG. 7C is a further enlarged view of the outer and inner slots P1 and P2 in FIG. 7B.

Referring to FIGS. 7A-7C, the slots 141 of this embodiment is different from FIGS. 3A-3C in that a concave area A2 is formed by the main body P21 and one end portion P22 of each inner slot P2, wherein the concave area A2 has an opening facing the outer slots P1, so as to efficiently relieve the residual stress on the diaphragm 14.

Figure 8A:
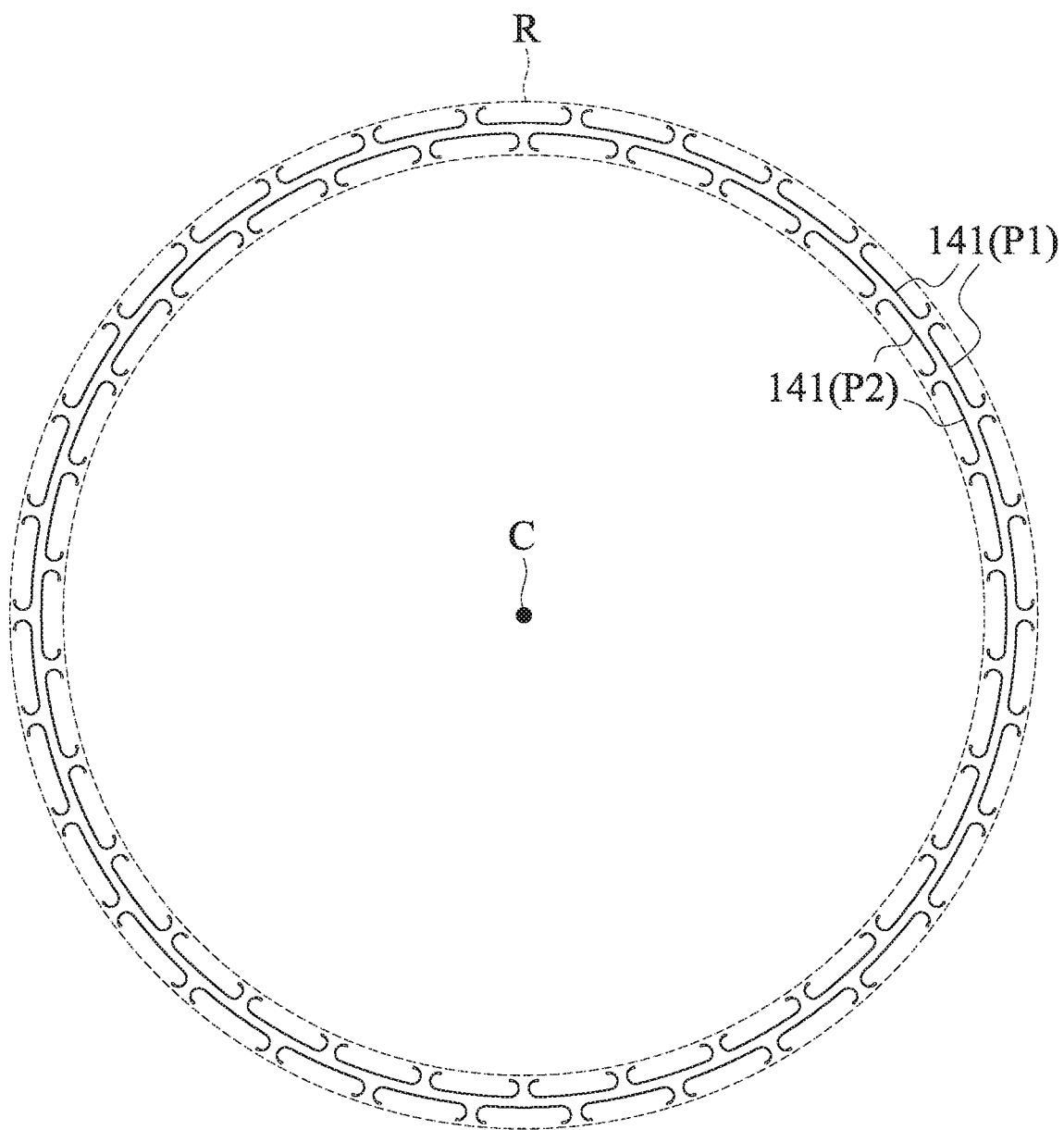
FIG. 8A is a schematic diagram showing another embodiment of the slots 141 configured in concentric circles around the center C of the diaphragm 14.
Figure 8C:
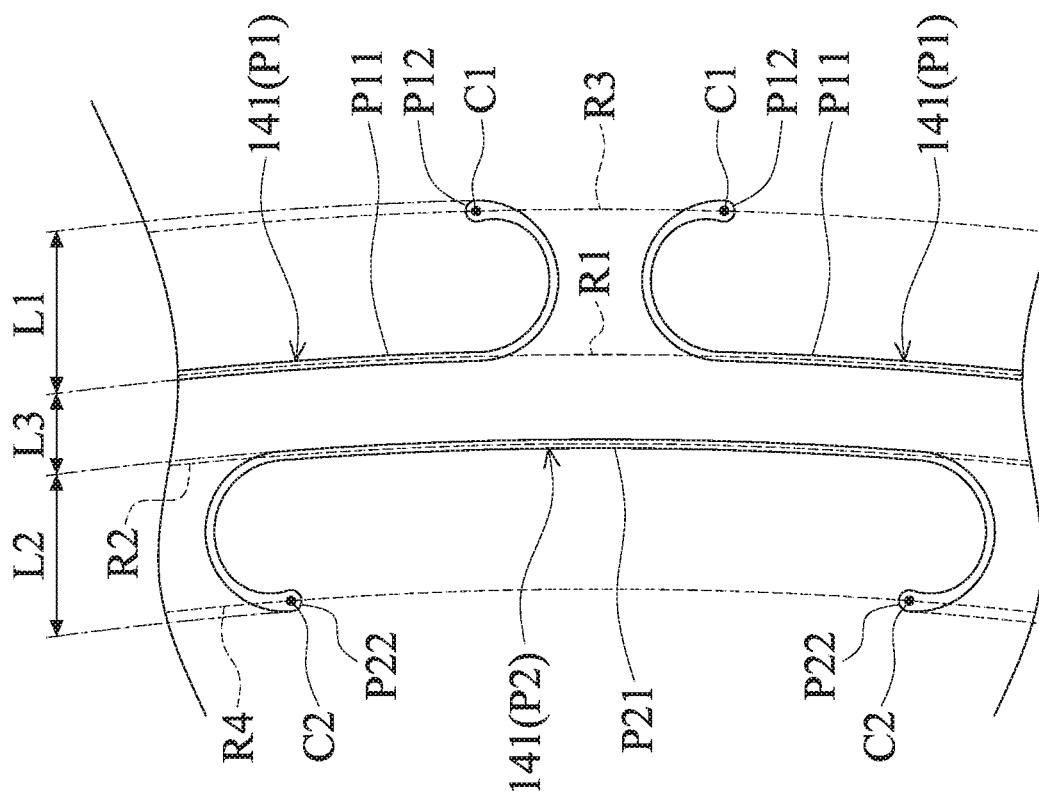
FIG. 8C is a further enlarged view of the outer and inner slots P1 and P2 in FIG. 8B.
Figure 8B:
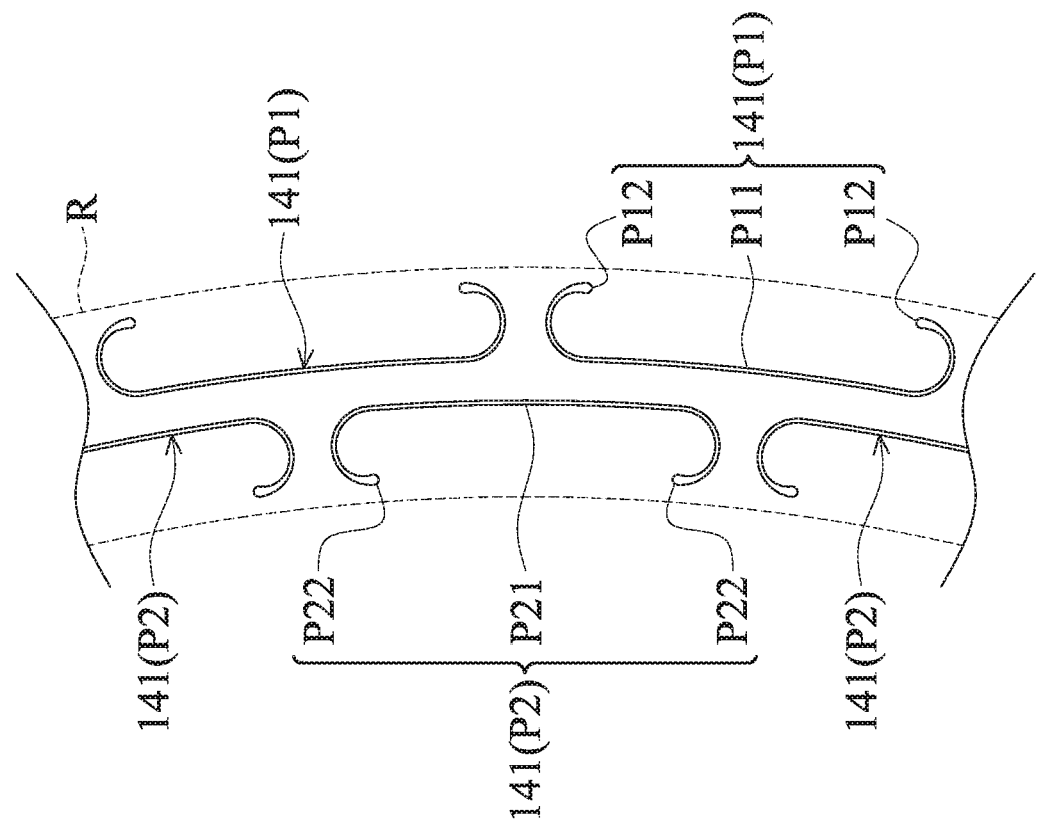
FIG. 8B is an enlarged view of the outer and inner slots P1 and P2 in FIG. 8A.

FIG. 8A is a schematic diagram showing another embodiment of the slots 141 configured in concentric circles around the center C of the diaphragm 14. FIG. 8B is an enlarged view of the outer and inner slots P1 and P2 in FIG. 8A. FIG. 8C is a further enlarged view of the outer and inner slots P1 and P2 in FIG. 8B.

Referring to FIGS. 8A-8C, the slots 141 of this embodiment is different from FIGS. 3A-3C in that the lengths L1 and L2 of the outer and inner slots P1 and P2 in a radial direction of the diaphragm 14 are greater than the distance L3 between the outer and inner slots P1 and P2 in the radial direction, whereby the residual stress on the diaphragm 14 can be efficiently relieved.

In summary, the invention provides a micro-electro-mechanical system (MEMS) microphone that comprises a substrate, a backplate, and a diaphragm disposed between the substrate and the backplate. A plurality of outer and inner slots are formed on the diaphragm and spaced apart from each other, wherein the outer and inner slots have a non-constant width, so as to reduce the stress concentration and endure the wind load on the diaphragm. Hence, the residual stress on the diaphragm can be efficiently relieved, thereby achieving high AOP and high sensitivity of the MEMS microphone.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A micro-electro-mechanical system (MEMS) microphone, comprising:
    a substrate;
    a backplate, disposed on a side of the substrate;
    a diaphragm, movably disposed between the substrate and the backplate; and
    a plurality of slots formed in an annular area of the diaphragm and spaced apart from each other, wherein the slots have a non-constant width to relieve the residual stress on the diaphragm, and the slots respectively form a main body and an end portion extending from the main body, and the end portion is wider than the main body.

2. The MEMS microphone of claim 1, wherein at least one of the slots further forms two end portions extending from the main body toward the outside or the inside of the diaphragm, and the end portions are wider than the main body.

3. The MEMS microphone of claim 1, wherein the slots include a plurality of outer slots and a plurality of inner slots arranged in concentric circles, and the outer slots respectively further form two end portions extending from the main body toward the outside or the inside of the diaphragm, wherein the end portions are wider than the main body.

4. The MEMS microphone of claim 3, wherein the outer slots respectively define a central line, and the end portions of the outer slots respectively define a center, wherein the centers of the end portions are located on a circle, and the central lines are tangent to the circle.

5. The MEMS microphone of claim 1, wherein the slots includes a plurality of outer slots and a plurality of inner slots arranged in concentric circles, and the inner slots respectively further form two end portions extending from the main body toward the outside or the inside of the diaphragm, wherein the end portions are wider than the main body.

6. The MEMS microphone of claim 5, wherein the inner slots respectively define a central line, and the end portions of the inner slots respectively define a center, wherein the centers of the end portions are located on a circle, and the central lines are tangent to the circle.

7. The MEMS microphone of claim 1, wherein the slots are arranged in concentric circles and respectively further form two end portions extending from the main body toward the outside of the diaphragm, and the end portions are wider than the main body.

8. The MEMS microphone of claim 1, wherein the slots are arranged in concentric circles and respectively further form two end portions extending from the main body toward the inside of the diaphragm, and the end portions are wider than the main body.

9. The MEMS microphone of claim 1, wherein the slots include a plurality of outer slots and a plurality of inner slots arranged in concentric circles, the outer slots respectively form a first end portion, and the inner slots respectively form a second end portion, wherein the first and second end portions extend in opposite directions.

10. The MEMS microphone of claim 1, wherein the non-constant width gradually increases from the main body to the end portion.

11. A micro-electro-mechanical system (MEMS) microphone, comprising:
    a substrate;
    a backplate, disposed on a side of the substrate;
    a diaphragm, movably disposed between the substrate and the backplate; and
    a plurality of slots formed on the diaphragm, wherein the slots are arranged in concentric circles and have a non-constant width to relieve the residual stress on the diaphragm, wherein the slots respectively form a main body and an end portion extending from the main body, and wherein the end portion is wider than the main body.

12. The MEMS microphone of claim 11, wherein at least one of the slots further forms two end portions extending from the main body toward the outside or the inside of the diaphragm, and the end portions are wider than the main body.

13. The MEMS microphone of claim 11, wherein the slots include a plurality of outer slots and a plurality of inner slots, and the outer slots respectively further form two end portions extending from the main body toward the outside or the inside of the diaphragm, wherein the end portions are wider than the main body.

14. The MEMS microphone of claim 13, wherein the outer slots respectively define a central line, and the end portions of the outer slots respectively define a center, wherein the centers of the end portions are located on a circle, and the central lines are tangent to the circle.

15. The MEMS microphone of claim 11, wherein the slots includes a plurality of outer slots and a plurality of inner slots, and the inner slots respectively further form two end portions extending from the main body toward the outside or the inside of the diaphragm, wherein the end portions are wider than the main body.

16. The MEMS microphone of claim 15, wherein the inner slots respectively define a central line, and the end portions of the inner slots respectively define a center, wherein the centers of the end portions are located on a circle, and the central lines are tangent to the circle.

17. The MEMS microphone of claim 11, wherein the slots respectively further form two end portions extending from the main body toward the outside of the diaphragm, and the end portions are wider than the main body.

18. The MEMS microphone of claim 11, wherein the slots respectively further form two end portions extending from the main body toward the inside of the diaphragm, and the end portions are wider than the main body.

19. The MEMS microphone of claim 11, wherein the slots include a plurality of outer slots and a plurality of inner slots, the outer slots respectively form a first end portion, and the inner slots respectively form a second end portion, wherein the first and second end portions extend in opposite directions.

20. The MEMS microphone of claim 11, wherein the non-constant width gradually increases from the main body to the end portion.

\* \* \* \* \*